US011894082B2

(12) United States Patent
Ji

(10) Patent No.: US 11,894,082 B2

(45) Date of Patent: Feb. 6, 2024

(54) ANTI-FUSE MEMORY AND CONTROL METHOD THEREOF

(71) Applicant: CHANGXIN MEMORY TECHNOLOGIES, INC., Hefei (CN)

(72) Inventor: Rumin Ji, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 89 days.

(21) Appl. No.: 17/712,070

(22) Filed: Apr. 2, 2022

(65) Prior Publication Data

US 2023/0207030 A1 Jun. 29, 2023

(30) Foreign Application Priority Data

Dec. 24, 2021 (CN) ......................... 202111602083.8

(51) Int. Cl.

*G11C 17/16* (2006.01)
*H01L 23/525* (2006.01)
*G11C 17/18* (2006.01)
*H10B 20/20* (2023.01)

(52) U.S. Cl.

CPC ............ *G11C 17/165* (2013.01); *G11C 17/18* (2013.01); *H01L 23/5252* (2013.01); *H10B 20/20* (2023.02)

(58) Field of Classification Search

CPC ................................ H10B 20/20; G11C 17/16
USPC ........................................................... 365/96
See application file for complete search history.

(56) References Cited

U.S. PATENT DOCUMENTS

| | | | | |
|---|---|---|---|---|
| 5,847,987 | A * | 12/1998 | Cutter | G11C 29/83 365/96 |
| 6,163,488 | A * | 12/2000 | Tanizaki | G11C 17/18 365/96 |
| 6,285,603 | B1 * | 9/2001 | Ku | G11C 29/83 365/225.7 |
| 6,574,129 | B1 * | 6/2003 | Tran | G11C 13/0004 65/97 |
| 2021/0183424 | A1 * | 6/2021 | Kim | G11C 7/1063 |

FOREIGN PATENT DOCUMENTS

WO 2003034331 A1 4/2003

* cited by examiner

*Primary Examiner* — Muna A Techane

(74) *Attorney, Agent, or Firm* — Kilpatrick Townsend & Stockton LLP

(57) ABSTRACT

Embodiments of the present disclosure relate to the field of semiconductor technology, and provide an anti-fuse memory and a control method thereof. The anti-fuse memory is configured to generate a programming pulse signal based on a row strobe signal, a word line of the anti-fuse memory array is configured to receive the row strobe signal, and the anti-fuse memory array is programmed in response to the programming pulse signal. The embodiments of the present disclosure are at least advantageous to improving accuracy of reading data from the anti-fuse memory array and improving yield of the anti-fuse memory.

16 Claims, 7 Drawing Sheets

ANTI-FUSE MEMORY AND CONTROL METHOD THEREOF

CROSS-REFERENCE TO RELATED APPLICATION

This application claims priority to Chinese Patent Application No. 202111602083.8, titled "ANTI-FUSE MEMORY AND CONTROL METHOD THEREOF" and filed to the China National Intellectual Property Administration on Dec. 24, 2021, the entire contents of which are incorporated herein by reference.

TECHNICAL FIELD

Embodiments of the present disclosure relate to the field of semiconductor technology, and more particularly, to an anti-fuse memory and a control method thereof.

BACKGROUND

An anti-fuse memory may be realized by means of an anti-fuse memory cell array. A gate oxide dielectric of an anti-fuse memory cell may be broken down after a high voltage is applied, and an impedance of a path broken down will decrease. By detecting a resistance state of the path broken down, information stored in the anti-fuse memory cell may be read out.

However, in traditional programming of the anti-fuse memory, a high programming voltage is applied to two ends of the anti-fuse memory cell. During the entire programming process, the high programming voltage remains unchanged. After the high programming voltage is maintained for a period of time, the anti-fuse memory cell is broken down and is in a low-resistance state. However resistance in the low-resistance state is still higher, which still has a negative effect on accuracy of reading information from the anti-fuse memory cell.

SUMMARY

Embodiments of the present disclosure provide an anti-fuse memory and a control method thereof, which are at least advantageous to improving accuracy of reading data from the anti-fuse memory and improving yield of the anti-fuse memory.

According to some embodiments of the present disclosure, one aspect of the embodiments of the present disclosure provides an anti-fuse memory. The anti-fuse memory is configured to generate a programming pulse signal based on a row strobe signal. A word line of an anti-fuse memory array is configured to receive the row strobe signal, and the anti-fuse memory array is programmed in response to the programming pulse signal.

In some embodiments, the anti-fuse memory is also configured to generate the programming pulse signal with an adjustable duty factor based on the row strobe signal.

In some embodiments, the anti-fuse memory is also configured to generate the programming pulse signal based on the row strobe signal and a reference pulse signal.

In some embodiments, the reference pulse signal is an internal clock signal.

In some embodiments, the anti-fuse memory includes a reference pulse signal generation module configured to output the reference pulse signal with the adjustable duty factor.

In some embodiments, the anti-fuse memory includes a pulse signal generation module configured to receive the row strobe signal and generate the programming pulse signal.

In some embodiments, the pulse signal generation module includes: a signal generation unit configured to output an initial pulse signal in response to the row strobe signal; and a level translator. The level translator is configured to perform level translation on the initial pulse signal to generate and output the programming pulse signal, and a level value of the programming pulse signal is greater than that of the initial pulse signal.

In some embodiments, the signal generation unit is also configured to output the initial pulse signal in response to the row strobe signal and the reference pulse signal simultaneously.

In some embodiments, the reference pulse signal has an adjustable duty factor.

In some embodiments, the signal generation unit includes a ring oscillator circuit, the row strobe signal is an enable signal of the ring oscillator circuit, and an output terminal of the ring oscillator circuit is configured to output the initial pulse signal.

In some embodiments, the ring oscillator circuit is configured to output the initial pulse signal with an adjustable duty factor.

In some embodiments, the ring oscillator circuit includes: a comparison circuit, an output terminal of the comparison circuit being configured to output the initial pulse signal; a pull-up module connected between an operating power source and an input terminal of the comparison circuit, the pull-up module being enabled in response to the row strobe signal and a first level signal outputted from the comparison circuit and being configured to pull up a voltage across the input terminal of the comparison circuit at a first speed, the first speed being adjustable; and a pull-down module connected between a ground terminal and the input terminal of the comparison circuit, the pull-down module being enabled in response to the row strobe signal and a second level signal outputted from the comparison circuit and being configured to pull down the voltage across the input terminal of the comparison circuit at a second speed, the second speed being adjustable, and a level value of the first level signal being different from that of the second level signal.

In some embodiments, the pull-up module includes a first current source and a first switch module. The first switch module is connected between the first current source and the input terminal of the comparison circuit, and the first switch module is enabled in response to the row strobe signal and the first level signal. The pull-down module includes a second current source and a second switch module. The second switch module is connected between the second current source and the input terminal of the comparison circuit, and the second switch module is enabled in response to the row strobe signal and the second level signal, wherein the first current source and/or the second current source is adjustable in magnitude of current.

In some embodiments, the comparison circuit includes a comparator and a second inverter connected in series with the comparator. An output terminal of the second inverter is configured to output the initial pulse signal. The first switch module includes a first switch transistor and a second switch transistor connected in series. The first current source is connected between the first switch transistor and the operating power source, a control terminal of the second switch transistor is connected to the output terminal of the second inverter, and the first switch transistor is enabled in response to the row strobe signal. The second switch module includes a third switch transistor and a fourth switch transistor connected in series. The second current source is connected between the fourth switch transistor and the ground terminal, a control terminal of the third switch transistor is connected to the output terminal of the second inverter, and the fourth switch transistor is enabled in response to the row strobe signal.

In some embodiments, the anti-fuse memory also includes a current adjustment module configured to adjust magnitude of current of the first current source and/or the second current source.

According to some embodiments of the present disclosure, another aspect of the embodiments of the present disclosure also provides a control method for an anti-fuse memory. The control method includes: generating a programming pulse signal in response to a row strobe signal; and programming in response to the programming pulse signal.

In some embodiments, the generating the programming pulse signal in response to the row strobe signal includes: generating the programming pulse signal in response to the row strobe signal and a reference pulse signal simultaneously, the reference pulse signal having an adjustable duty factor.

In some embodiments, the generating a programming pulse signal in response to the row strobe signal includes: generating the programming pulse signal having an adjustable duty factor in response to the row strobe signal.

The technical solutions provided by the embodiments of the present disclosure have following advantages.

A word line of an anti-fuse memory array receives a row strobe signal and generates a programming pulse signal based on the row strobe signal, and the anti-fuse memory array is programmed in response to the programming pulse signal, such that in the whole programming process of an anti-fuse memory cell, a level value of a programming voltage changes periodically to avoid a problem of overheating after the anti-fuse memory cell is broken down. This is advantageous to reducing a probability of damage to the anti-fuse memory array and to reducing a resistance of the anti-fuse memory cell broken down in a low-resistance state. Therefore, it is advantageous to improving a success rate of reading data from the anti-fuse memory cell, to improving accuracy of reading data from the anti-fuse memory cell, and to improving yield of the anti-fuse memory cell.

BRIEF DESCRIPTION OF THE DRAWINGS

Exemplary descriptions are made to one or more embodiments with reference to pictures in the corresponding drawings, and these exemplary descriptions do not constitute limitations on the embodiments, and elements with the same reference numerals in the drawings are denoted as similar elements. Unless otherwise stated, the figures in the accompanying drawings do not constitute a scale limitation. To describe the technical solutions of the embodiments of the present disclosure or those of the prior art more clearly, the accompanying drawings required for describing the embodiments will be briefly introduced below. Apparently, the accompanying drawings in the following description are merely some embodiments of the present disclosure. To those of ordinary skills in the art, other accompanying drawings may also be derived from these accompanying drawings without creative efforts.

DETAILED DESCRIPTION

As can be known from the background art, accuracy of reading information from an anti-fuse memory array needs to be improved.

Figure 1:
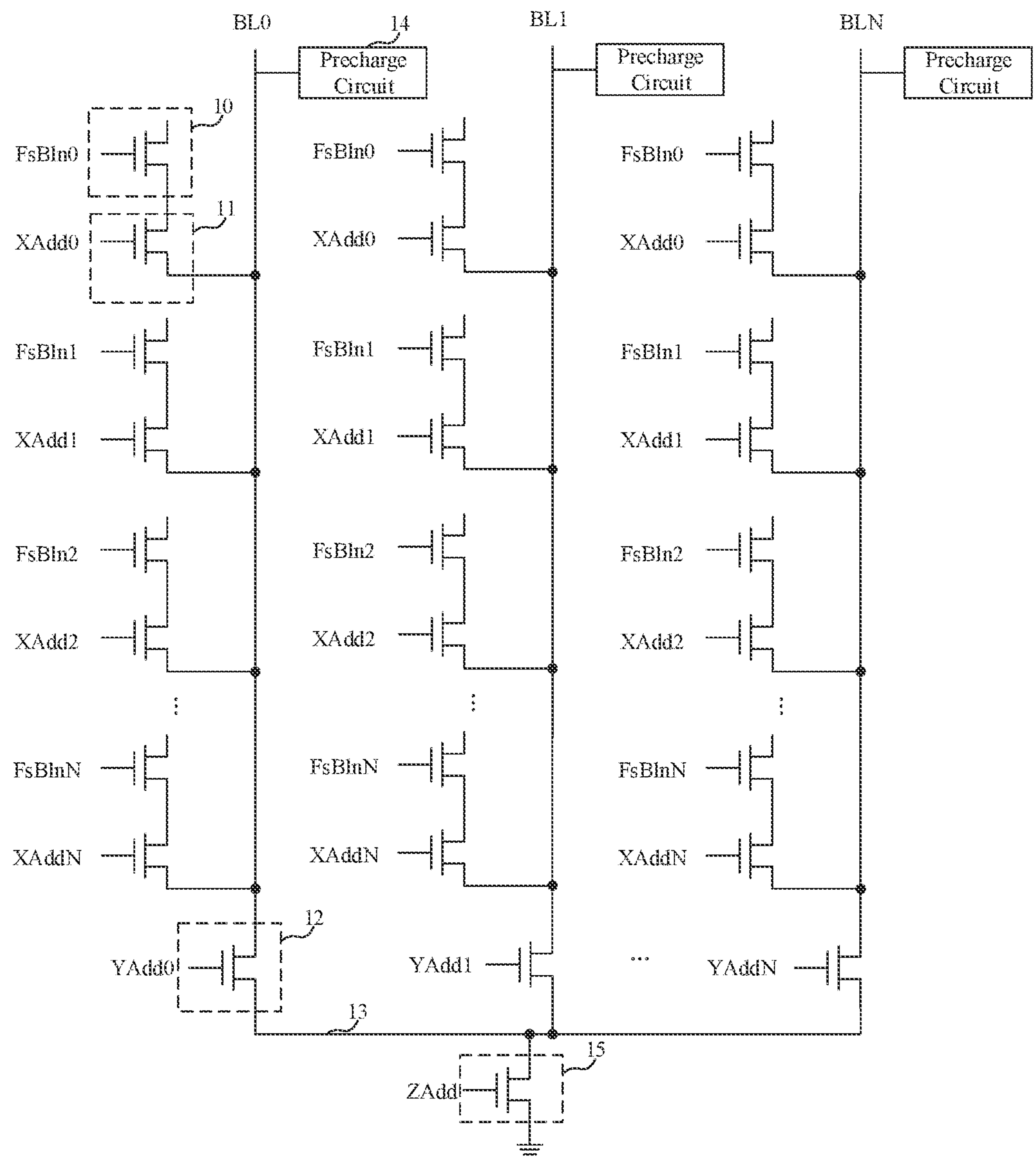
FIG. 1 is a schematic diagram showing a circuit structure of an anti-fuse storage circuit.

FIG. 1 is a schematic diagram showing a circuit structure of an anti-fuse storage circuit.

Referring to FIG. 1, an anti-fuse memory includes:

an anti-fuse memory array including a plurality of anti-fuse memory cells 10. The plurality of anti-fuse memory cells 10 are enabled in response to receiving a programming voltage signal marked by FsBln0, FsBln1, FsBln2 . . . , or FsBlnN. Each of the plurality of anti-fuse memory cells 10 represents 1 bit of data stored based on a fact whether a gate oxide layer is broken down. It is to be noted that taking the anti-fuse memory cell 10 receiving "FsBln0" as an example, "0" represents that the anti-fuse memory cell 10 is connected to a zeroth word line; taking the anti-fuse memory cell 10 receiving "FsBln2" as an example, "2" represents that the anti-fuse memory cell 10 is connected to a second word line, and "N" in "FsBlnN" represents that the anti-fuse memory cell 10 receiving "FsBlnN" is connected to an $N^{th}$ word line.

The anti-fuse memory also includes a plurality of bit lines denoted by BL0, BL1 . . . , and BLN, the plurality of anti-fuse memory cells 10 are connected to the plurality of bit lines by means of a first switch transistor 11 in extension directions of the plurality of bit lines.

A gate of the first switch transistor 11 is configured to receive a row strobe signal marked by XAdd0, XAdd1, XAdd2 . . . , or XAddN, one end of a source or drain of the first switch transistor 11 is connected to the plurality of anti-fuse memory cells 10 10, and other end of the first switch transistor 11 is connected to the plurality of bit lines. It is to be noted that taking the first switch transistor 11 receiving "XAdd0" as an example, "0" represents that the first switch transistor 11 is connected to a zeroth word line; taking the first switch transistor 11 receiving "XAdd2" as an example, "2" represents that the first switch transistor 11 is connected to a second word line, and "N" in "XAddN" represents that the first switch transistor 11 receiving "XAddN" is connected to an $N^{th}$ word line. It is to be noted that the row strobe signal is configured for selecting and enabling the word line connected to the selected first switch transistor 11. The row strobe signal is a word line strobe signal, and is configured for selecting a target word line from a large number of word lines, and enabling the first switch transistor 11 connected to the target word line.

The anti-fuse memory also includes a second switch transistor 12. A gate of the second switch transistor 12 is configured to receive a column strobe signal, which is marked by YAdd0, YAdd1, . . . , or YAddN, one end of a source or drain of the second switch transistor 12 is connected to the plurality of bit lines, and other end of the source or drain of the second switch transistor 12 is connected to a transmission line 13. It is to be noted that, taking the second switch transistor 12 receiving "YAdd0" as an example, "0" represents that the second switch transistor 12 is connected to the bit line BL0; taking the second switch transistor 12 receiving "YAdd1" as an example, "1" represents that the second switch transistor 12 is connected to the bit line BL1, and "N" in "YAddN" represents that the second switch transistor 12 receiving "YAddN" is connected to the bit line BLN. It is to be noted that the column strobe signal is configured for selecting and enabling the bit line connected to the selected second switch transistor 12. The column strobe signal is a bit line strobe signal, and is configured for selecting a target bit line from the plurality of bit lines, and enabling the second switch transistor 12 connected to the target bit line.

The anti-fuse memory also includes a precharge circuit 14 connected to the plurality of bit lines in an extension direction thereof. The precharge circuit 14 is configured to precharge the plurality of bit lines to a precharge voltage according to a precharge signal.

The anti-fuse memory also includes a third switch transistor 15. One end of a source or drain of the third switch transistor 15 is connected to the transmission line 13, and other end of the source or drain of the third switch transistor 15 is grounded, and a gate of the third switch transistor 15 is configured to receive a discharge signal ZAdd and discharge electric charges in the transmission line 13 according to the discharge signal ZAdd.

Taking the anti-fuse memory unit 10 receiving "FsBlnN" as an example, a working principle of the anti-fuse storage circuit provided in FIG. 1 will be described in detail below.

The first switch transistor 11 is enabled based on "XAddN", and the second switch transistor 12 is enabled based on "YAdd0". In this case, the anti-fuse memory cell 10 receiving "FsBlnN" that is electrically connected to the bit line BL0 by means of the first switch transistor 11 may be selected. In a data programming phase, in the process of programming the anti-fuse memory cell 10 receiving "FsBlnN" based on "FsBlnN", the third switch transistor 15 is enabled based on "ZAdd", and the electric charges in the transmission line 13 are discharged by means of the third switch transistor 15, such that the voltage across a source terminal of the anti-fuse memory cell 10 is at a low level, to ensure accuracy of data programming of the anti-fuse memory cell 10 receiving "FsBlnN". In a data readout phase, the third switch transistor 15 is disabled based on "ZAdd", and the precharge circuit 14 receives the precharge signal to precharge the plurality of bit lines to the precharge voltage. At this moment, the transmission line 13 is electrically connected to the precharge circuit 14 and is precharged to the precharge voltage, to read the data stored in the anti-fuse memory cell 10 receiving "FsBlnN". In addition, the precharge circuit 14 is also configured to charge the plurality of bit lines, to prevent other anti-fuse memory cells 10 receiving the same programming signal as a target anti-fuse memory cell 10 from being broken down. In some embodiments, the target anti-fuse memory cell 10 is an anti-fuse memory cell to be programmed. Before programming the target anti-fuse memory cell 10, a level of the bit line (e.g. BL1) connected to the target anti-fuse memory cell 10 is pulled down to a low level, such that it is ensured that the target anti-fuse memory cell 10 has a larger gate-source voltage difference under the programming voltage to achieve effective programming. Meanwhile, other bit lines (e.g. BL1 and BL2) are precharged to a preset level, to prevent other anti-fuse memory cells 10 receiving the same programming signal from being broken down due to the larger gate-source voltage difference.

However, it is found through analysis that during the programming process, the programming voltage signal applied to each of the plurality of anti-fuse memory cells 10 of the anti-fuse memory array is always a high level, and the high level is maintained for the same duration. The anti-fuse memory cells 10 have a problem of uneven electrical properties. That is, the electrical properties of different anti-fuse memory cells 10 are different, which leads to a fact that time required to break down insulating dielectric layers of different anti-fuse memory cells 10 under the same voltage is different. However, a high level applied to different anti-fuse memory cell 10 maintains the same length of time. For the anti-fuse memory cell 10 whose insulating dielectric layer has been broken down, if the programming voltage with an unchanged level is still applied, this may cause overheating of the anti-fuse memory cell 10, and thus it is prone to causing malfunction of the anti-fuse memory cell 10. Furthermore, this may lead to a larger resistance of the anti-fuse memory cell 10 broken down in a low-resistance state, thereby reducing accuracy of reading data from the anti-fuse memory unit 10 and reducing yield of the anti-fuse memory.

An embodiment of the present disclosure provides an anti-fuse memory and a control method thereof. The anti-fuse memory receives a row strobe signal, generates a programming pulse signal based on the row strobe signal, and programmes in response to the programming pulse signal, such that in the whole programming process of an anti-fuse memory cell, a level value of a programming voltage changes periodically to avoid a problem of overheating after the anti-fuse memory cell is broken down. In one aspect, this is advantageous to reducing a probability of damage to the anti-fuse memory and to improving yield of the anti-fuse memory. In another aspect, this is advantageous to reducing a resistance of the anti-fuse memory cell broken down in a low-resistance state. Therefore, it is advantageous to improving a success rate of reading data from the anti-fuse memory cell, and to improving accuracy of reading data from the anti-fuse memory.

To make the objectives, technical solutions and advantages of the embodiments of the present disclosure more clear, the embodiments of the present disclosure will be described in detail below with reference to the accompanying drawings. However, a person of ordinary skill in the art may understand that in the embodiments of the present disclosure, many technical details are put forward such that a reader may better understand the present disclosure. However, the technical solutions requested to be protected by the present disclosure may also be implemented even without these technical details or various variations and modifications based on the following embodiments.

Figure 2:
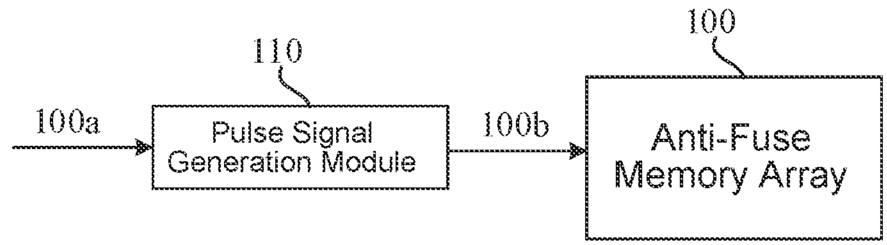
FIG. 2 is a schematic structural diagram of a functional module of an anti-fuse memory according to an embodiment of the present disclosure.
Figure 3:
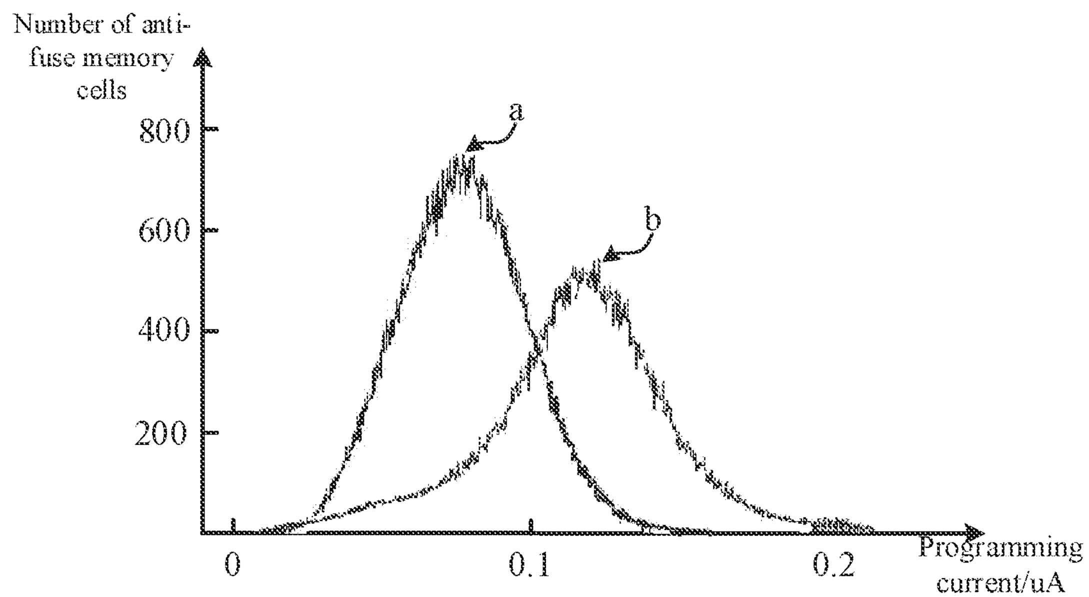
FIG. 3 is a curve graph obtained by testing an anti-fuse memory array when a programming voltage signal is a DC signal or a pulse signal.
Figure 4:
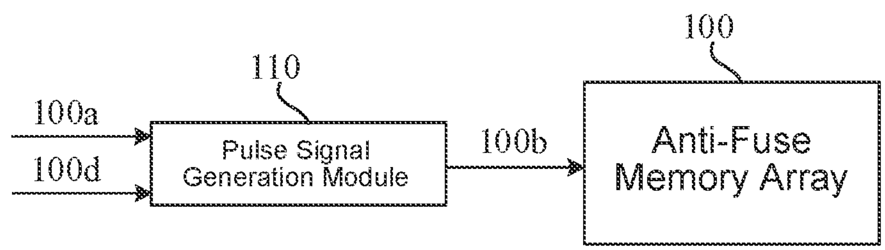
FIG. 4 is a schematic structural diagram of another functional module of an anti-fuse memory according to an embodiment of the present disclosure.

An embodiment of the present disclosure provides an anti-fuse memory. The anti-fuse memory provided by an embodiment of the present disclosure will be described in detail below with reference to the accompanying drawings. FIG. 2 is a schematic structural diagram of a functional module of the anti-fuse memory according to an embodiment of the present disclosure; FIG. 3 is a curve graph obtained by testing an anti-fuse memory array when a programming voltage signal is a DC signal or a pulse signal; FIG. 4 is a schematic structural diagram of another functional module of the anti-fuse memory according to an embodiment of the present disclosure; and FIGS. 5 to 11 are seven schematic structural diagrams of the anti-fuse memory according to an embodiment of the present disclosure.

In some embodiments of the present disclosure, referring to FIG. 2, the anti-fuse memory is configured to generate a programming pulse signal 100*b* based on a row strobe signal 100*a*, a word line WL of an anti-fuse memory array 100 is configured to receive the row strobe signal 100*a*, and the anti-fuse memory array 100 is programmed in response to the programming pulse signal 100*b*.

It is to be noted that the anti-fuse memory array 100 includes a plurality of anti-fuse memory cells, and each of the plurality of anti-fuse memory cells represents 1 bit of data stored based on a fact whether a gate oxide layer is broken down, and programming the anti-fuse memory array 100 represents programming a target anti-fuse memory cell in the anti-fuse memory array 100. When the anti-fuse memory array 100 is programmed in response to the programming pulse signal 100*b*, for a given one of the plurality of anti-fuse memory cells, during the entire programming process of the given anti-fuse memory cell, the level value of the programming voltage applied to the given anti-fuse memory cell changes periodically to avoid the problem of overheating after the given anti-fuse memory cell is broken down. In one aspect, this is advantageous to reducing the probability of damage to the given anti-fuse memory and to improving yield of given the anti-fuse memory, such that it is advantageous to improving yield of the anti-fuse memory. In another aspect, this is advantageous to reducing the resistance of the given anti-fuse memory cell broken down in the low-resistance state. Therefore, it is advantageous to improving the success rate of reading the data from the given anti-fuse memory cell, and to improving the accuracy of reading the data from the anti-fuse memory array 100.

Referring to FIG. 3, FIG. 3 is a curve graph obtained by testing an anti-fuse memory array when a programming voltage signal is a DC signal or a pulse signal, wherein the curve a is a curve graph showing a relationship between a test current of the anti-fuse memory cells programmed and number of the corresponding anti-fuse memory cells when the programming voltage signal is the DC signal; and the curve b is a curve graph showing a relationship between the test current of the anti-fuse memory cells programmed and the number of the corresponding anti-fuse memory cells when the programming voltage signal is the pulse signal. It is to be noted that the pulse signal is the programming pulse signal 100*b*.

As can be seen by referring to FIG. 3, when programming the same number of anti-fuse memory cells, an average test current of the anti-fuse memory cells programmed in response to the programming pulse signal 100*b* is greater than an average test current of the anti-fuse memory cells programmed in response to the DC signal. That is, programming the anti-fuse memory cells by means of the programming pulse signal 100*b* is advantageous to reducing the resistance of the anti-fuse memory cells broken down in the low-resistance state, and thus is advantageous to improving the accuracy of reading the data from the anti-fuse memory cells. After the programming, the corresponding test current may be obtained by applying a preset test voltage to an original gate of the anti-fuse memory cell. It is to be understood that the smaller the resistance of the anti-fuse memory cell broken down is, the larger the test current is. That is, the larger the average test current is, the smaller an average resistance of the anti-fuse memory cell broken down is, and the higher the readout accuracy is.

In some embodiments, the anti-fuse memory may also be configured to generate the programming pulse signal 100*b* with an adjustable duty factor based on the row strobe signal 100*a*.

Due to some unavoidable differences or artificial settings in processes, different anti-fuse memory cells have a problem of uneven electrical properties. That is, the electrical properties of different anti-fuse memory cells are different, which leads to a fact that time required to break down the insulating dielectric layers of different anti-fuse memory cells under the same voltage is different. By adjusting the duty factor of the programming pulse signal 100*b*, the time required to break down the anti-fuse memory cells programmed based on the programming pulse signal 100*b* is controlled, to satisfy a fact that the anti-fuse memory cells with different electrical properties can be programmed based on the programming pulse signal 100*b*. This is advantageous to improving the accuracy of reading the data from the anti-fuse memory cells and improving the yield of the anti-fuse memory.

In some embodiments, referring to FIG. 4, the anti-fuse memory may also be configured to generate the programming pulse signal 100*b* based on the row strobe signal 100*a* and a reference pulse signal 100*d*.

It is to be noted that in some examples, the duty factor of the programming pulse signal 100*b* is adjustable; and in some other examples, the duty factor of the programming pulse signal 100*b* may also be a fixed value.

How to generate the programming pulse signal 100*b* with an adjustable duty factor based on the row strobe signal 100*a* and the reference pulse signal 100*d* is described in detail below by means of two embodiments.

In some examples, the duty factor of the reference pulse signal 100*d* is adjustable, such that the duty factor of the programming pulse signal 100*b* generated based on the row strobe signal 100*a* and the reference pulse signal 100*d* is adjustable. In still some other examples, the duty factor of the reference pulse signal 100*d* remains unchanged, and in this case the duty factor of the programming pulse signal 100*b* is directly adjusted.

How to generate the reference pulse signal 100*d* may be described in detail by means of the following two embodiments.

In some embodiments, the reference pulse signal 100*d* may be an internal clock signal. It is to be understood that the internal clock signal may be a clock signal generated by an existing module in the anti-fuse memory, and serves as the reference pulse signal 100*d* to generate the programming pulse signal 100*b* in conjunction with the row strobe signal 100*a*. As thus, there is no need to additionally provide a clock signal generation module, which is advantageous to reducing manufacturing costs of the anti-fuse memory.

In some other embodiments, the anti-fuse memory may include a reference pulse signal generation module (not shown) configured to output the reference pulse signal 100*d* with an adjustable duty factor. The programming pulse signal 100*b* is generated based on the row strobe signal 100*a* and the reference pulse signal 100*d*. Thus, when the duty factor of the reference pulse signal 100*d* is adjustable, the duty factor of the programming pulse signal 100*b* may also be adjusted by adjusting the duty factor of the reference pulse signal 100*d*. In this way, all the anti-fuse memory cells with different electrical properties can be programmed based on the programming pulse signal 100*b*, such that it is advantageous to improving the accuracy of reading the data from the anti-fuse memory array and improving the yield of the anti-fuse memory.

The structure of the anti-fuse memory is described in detail below with reference to FIG. 2 and FIGS. 5 to 11.

Referring to FIG. 2, the anti-fuse memory includes a pulse signal generation module 110 configured to receive the row strobe signal 100*a* and generate the programming pulse signal 100*b*. As thus, in the entire programming process of the anti-fuse memory array 100, the level value of the programming voltage formed based on the programming pulse signal 100*b* changes periodically, to avoid the problem of overheating after the anti-fuse memory cell is broken down. This is advantageous to improving the accuracy of reading the data from the anti-fuse memory cell and improving the yield of the anti-fuse memory.

Figure 5:
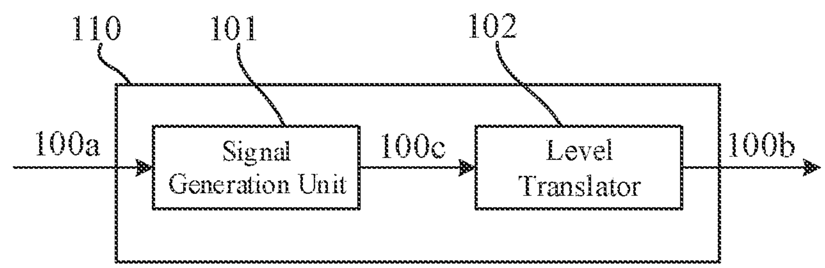
FIGS. 5 to 11 are seven schematic structural diagrams of an anti-fuse memory according to an embodiment of the present disclosure.

In some embodiments, referring to FIG. 5, the pulse signal generation module 110 includes: a signal generation unit 101 configured to output an initial pulse signal 100*c* in response to the row strobe signal 100*a*; and a level translator 102 configured to perform level translation on the initial pulse signal 100*c* to generate and output the programming pulse signal 100*b*. A level value of the programming pulse signal 100*b* is greater than that of the initial pulse signal 100*c*.

A level peak value of the initial pulse signal 100*c* is adjusted by means of the level translator 102, to obtain the programming pulse signal 100*b* with a higher level peak value. That is, the programming pulse signal 100*b* is in a high-voltage power domain, such that the programming voltage formed based on the programming pulse signal 100*b* is higher. This is advantageous to ensuring that the anti-fuse memory cells that need to be programmed in the anti-fuse memory are broken down, and to improving the success rate of reading the data from the anti-fuse memory. In one example, after the initial pulse signal 100*c* is translated by the level translator 102 to generate the programming pulse signal 100*b*, the programming voltage formed based on the programming pulse signal 100*b* may reach up to 6V.

When the row strobe signal 100*a* is at a high level, the programming pulse signal 100*b* is a high-voltage pulse signal. When programming a given anti-fuse memory cell in the anti-fuse memory based on the programming pulse signal 100*b*, it is advantageous to reducing a resistance of the anti-fuse memory cell broken down in a low-resistance state. Therefore, it is advantageous to improving the success rate of reading the data from the anti-fuse memory cell, and to improving programming effect of the anti-fuse memory. When the row strobe signal 100*a* is at a low level, this indicates that the programming of the anti-fuse memory cell is ended. At this moment, the programming pulse signal 100*b* is also at a low level, applying a high voltage to the anti-fuse memory cell is stopped to avoid the problem of overheating of the anti-fuse memory cell.

The structure of the signal generation unit 101 will be described in detail below by means of two embodiments.

Figure 6:
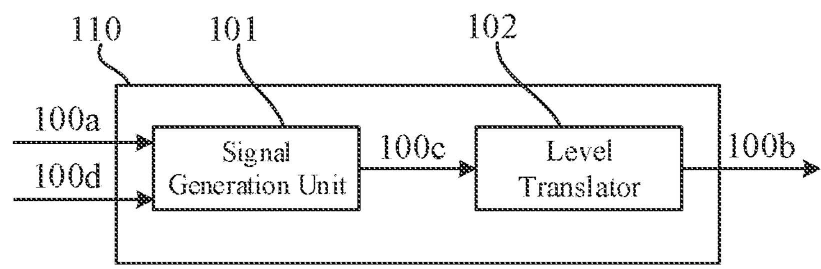

In some embodiments, referring to FIG. 6, the signal generation unit 101 may be configured to output the initial pulse signal 100*c* in response to the row strobe signal 100*a* and the reference pulse signal 100*d* simultaneously.

The reference pulse signal 100*d* has an adjustable duty factor. The initial pulse signal 100*c* is generated based on the row strobe signal 100*a* and the reference pulse signal 100*d*. Thus, when the duty factor of the reference pulse signal 100*d* is adjustable, the duty factor of the initial pulse signal 100*c* may also be adjusted by adjusting the duty factor of the reference pulse signal 100*d*. Subsequently, when the initial pulse signal 100*c* is translated by the level translator 102 to generate the programming pulse signal 100*b*, the duty factor of the programming pulse signal 100*b* is also adjustable. In this way, all the anti-fuse memory cells with different electrical properties can be programmed based on the programming pulse signal 100*b*, such that it is advantageous to improving the accuracy of reading the data from the anti-fuse memory and improving the yield of the anti-fuse memory.

Figure 7:
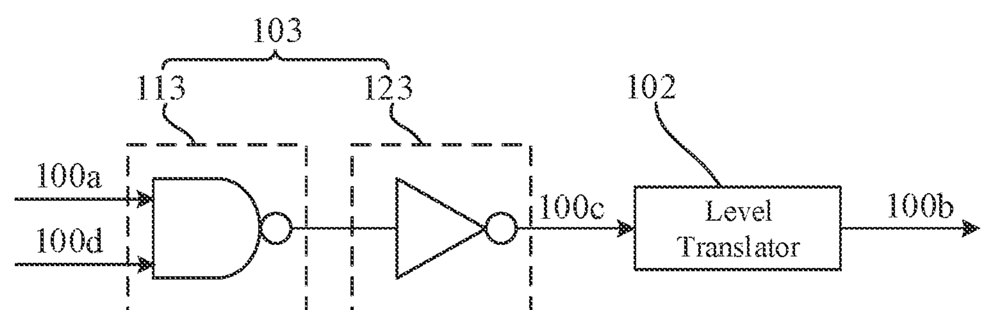

In some embodiments, referring to FIG. 7, the signal generation unit 101 (referring to FIG. 6) may include an AND gate circuit 103. One input terminal of the AND gate circuit 103 is configured to receive the row strobe signal 100*a*, other input terminal of the AND gate circuit 103 is configured to receive the reference pulse signal 100*d*, and an output terminal of the AND gate circuit 103 is configured to output the initial pulse signal 100*c*.

With continued reference to FIG. 7, the AND gate circuit 103 may include: an NAND gate 113, wherein two input terminals of the NAND gate 113 are respectively configured to receive the row strobe signal 100*a* and the reference pulse signal 100*d*; and a first inverter 123, wherein an output terminal of the NAND gate 113 is connected to an input terminal of the first inverter 123. The NAND gate 113 and the first inverter 123 act together to achieve logic and operation of the row strobe signal 100*a* and the reference pulse signal 100*d* to form the initial pulse signal 100*c*.

It is to be noted that in FIG. 7 series connection of the NAND gate 113 and the first inverter 123 to achieve the logic and operation of the AND gate circuit 103 merely serves as an example. In practical applications, any circuit that can achieve the logic and operation and can receive the row strobe signal 100*a* and the reference pulse signal 100*d* may serve as the AND gate circuit 103 in the embodiments of the present disclosure. That is, the embodiments of the present disclosure do not limit the form of the AND gate circuit 103.

Figure 8:
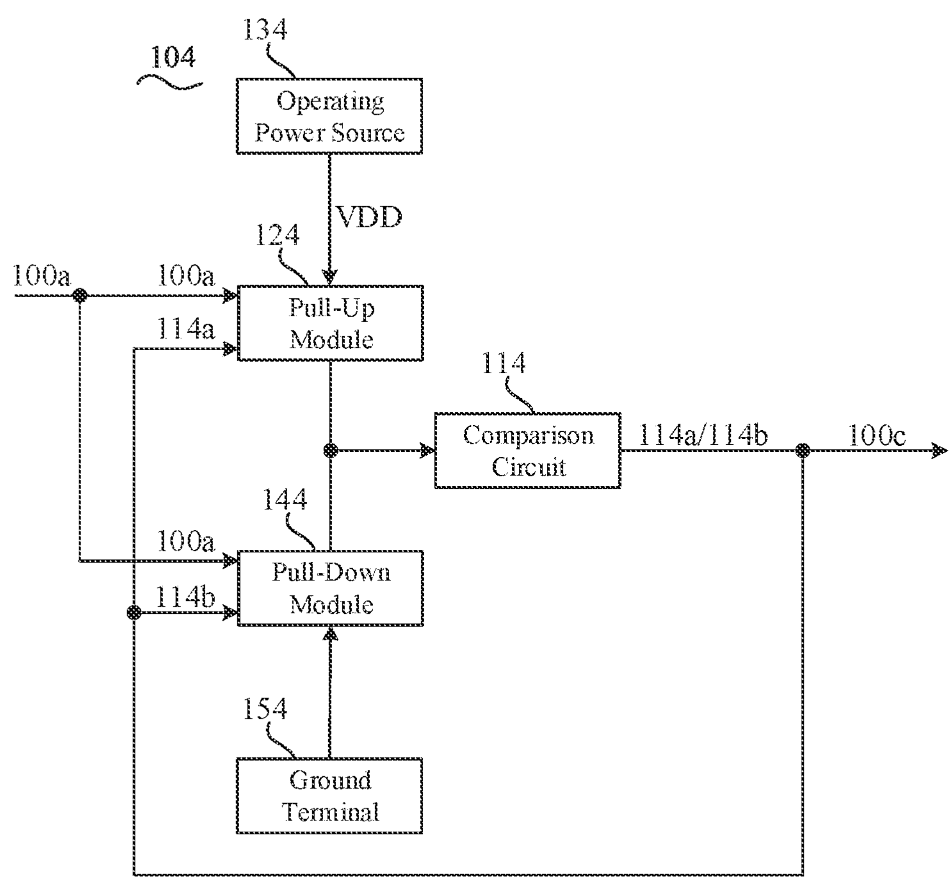

In some other embodiments, referring to FIG. 8, the signal generation unit 101 (referring to FIG. 6) may include a ring oscillator circuit 104. The row strobe signal 100*a* is an enable signal of the ring oscillator circuit 104, and an output terminal of the ring oscillator circuit 104 is configured to output the initial pulse signal 100*c*. As thus, the anti-fuse memory may generate the programming pulse signal 100*b* with an adjustable duty factor only based on the row strobe signal 100*a*.

The ring oscillator circuit 104 may be configured to output the initial pulse signal 100*c* with an adjustable duty factor. That is, an oscillation rate of the ring oscillator circuit 104 is adjustable. The duty factor of the initial pulse signal 100*c* is adjustable. Thus, when subsequently the initial pulse signal 100*c* is translated by the level translator 102 to generate the programming pulse signal 100*b*, the duty factor of the programming pulse signal 100*b* is also adjustable. In this way, all the anti-fuse memory cells with different electrical properties can be programmed based on the programming pulse signal 100*b*, such that it is advantageous to improving the accuracy of reading the data from the anti-fuse memory and improving the yield of the anti-fuse memory.

In some embodiments, with continued reference to FIG. 8, the ring oscillator circuit 104 includes: a comparison circuit 114, wherein an output terminal of the comparison circuit 114 is configured to output the initial pulse signal 100*c*; a pull-up module 124 connected between an operating power source 134 and an input terminal of the comparison circuit 114, wherein the pull-up module 124 is enabled in response to the row strobe signal 100*a* and a first level signal 114*a* outputted from the comparison circuit 114 and is configured to pull up a voltage across the input terminal of the comparison circuit 114 at a first speed, and the first speed is adjustable; and a pull-down module 144 connected between a ground terminal 154 and the input terminal of the comparison circuit 114, wherein the pull-down module 144 is enabled in response to the row strobe signal 100*a* and a second level signal 114*b* outputted from the comparison circuit 114 and is configured to pull down the voltage across the input terminal of the comparison circuit 114 at a second speed. The second speed is adjustable, and a level value of the first level signal 114*a* is different from that of the second level signal 114*b*.

It is to be understood that when programming a given anti-fuse memory cell of the anti-fuse memory, the row strobe signal 100*a* is at a high level, and the pull-up module 124 is enabled based on the row strobe signal 100*a* and the first level signal 114*a* to transmit an operating voltage VDD of the operating power source 134 to the input terminal of the comparison circuit 114 at the first speed, and to pull up the voltage across the input terminal of the comparison circuit 114. At this moment, the pull-down module 144 is in an off state based on the row strobe signal 100*a* and the first level signal 114*a*. When the voltage across the input terminal of the comparison circuit 114 is pulled up to a first preset value, the output terminal of the comparison circuit 114 outputs the second level signal 114*b*. Next, the pull-down module 144 is enabled based on the row strobe signal 100*a* and the second level signal 114*b* to transmit the voltage across the ground terminal 154 to the input terminal of the comparison circuit 114 at the second speed, and to pull down the voltage across the input terminal of the comparison circuit 114. At this moment, the pull-up module 124 is in the off state based on the row strobe signal 100*a* and the second level signal 114*b*. When the voltage across the input terminal of the comparison circuit 114 is pulled down to a second preset value, the output terminal of the comparison circuit 114 outputs the first level signal 114*a* to enable the pull-up module 124 again . . . and so on and so forth, such that the ring oscillator circuit 104 generates the initial pulse signal 100*c* based on the row strobe signal 100*a*. In addition, because the first speed is adjustable and the second speed is also adjustable, a time difference between outputting the second level signal 114*b* and outputting the second level signal 114*b* by the output terminal of the comparison circuit 114 is adjustable, to achieve the adjustment of the duty factor of the initial pulse signal 100*c* outputted by the output terminal of the comparison circuit 114.

The level value of the first level signal 114*a* is smaller than that of the second level signal 114*b*, and the first preset value is greater than the second preset value. In practical applications, the level value of the first level signal 114*a* is may also be greater than that of the second level signal 114*b*. By providing the comparison circuit 114 having the first preset value and the second preset value, it is advantageous to prolonging a period length of the initial pulse signal 100*c*, preventing the overheating of the anti-fuse memory cell caused by an excessively high programming pulse frequency, ensuring a smaller resistance after the anti-fuse memory cell is broken down, and ensuring resistance measurement accuracy of the anti-fuse memory cell.

Figure 9:
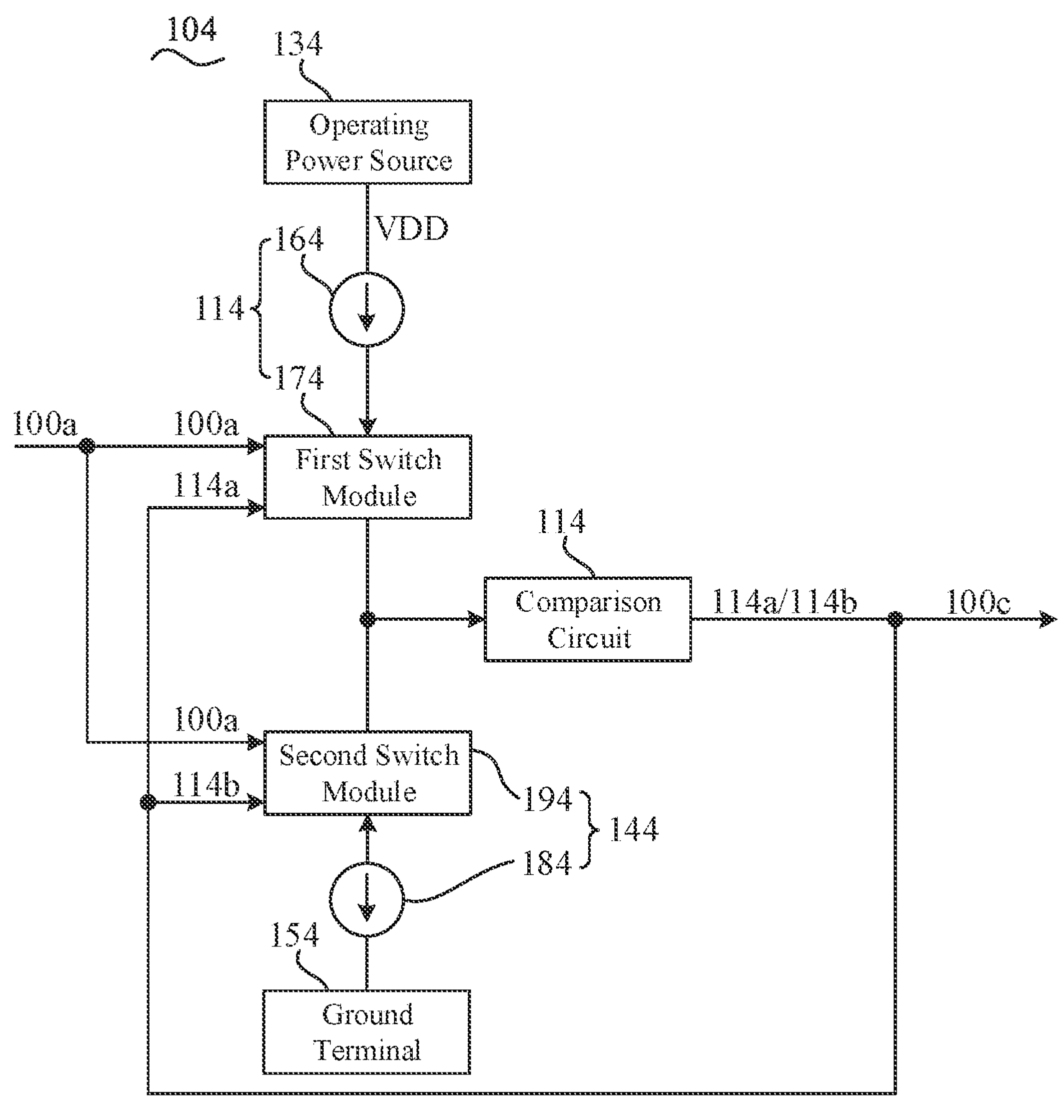

In some embodiments, referring to FIG. 9, the pull-up module 114 may include a first current source 164 and a first switch module 174. The first switch module 174 is connected between the first current source 164 and the input terminal of the comparison circuit 114, and the first switch module 174 is enabled in response to the row strobe signal 100*a* and the first level signal 114*a*. The pull-down module 144 may include a second current source 184 and a second switch module 194. The second switch module 194 is connected between the second current source 184 and the input terminal of the comparison circuit 114, and the second switch module 194 is enabled in response to the row strobe signal 100*a* and the second level signal 114*b*, and the first current source 164 and/or the second current source 184 is adjustable in magnitude of current.

As thus, the first speed may be adjusted by adjusting the magnitude of current of the first current source 164. That is, by adjusting the magnitude of current of the first current source 164, time required to pull up the voltage across the input terminal of the comparison circuit 114 to the first preset value when the first switch module 174 is enabled may be adjusted. The second speed may be adjusted by adjusting the magnitude of current of the second current source 184. That is, by adjusting the magnitude of current of the second current source 184, time required to pull down the voltage across the input terminal of the comparison circuit 114 to the second preset value when the second switch module 194 is enabled may be adjusted. In this way, adjustment of the duty factor of the initial pulse signal 100*c* outputted by the output terminal of the comparison circuit 114 may be achieved.

The anti-fuse memory may also include: a current adjustment module (not shown in the figure) configured to adjust the magnitude of the current of the first current source 164 and/or the second current source 184.

Figure 10:
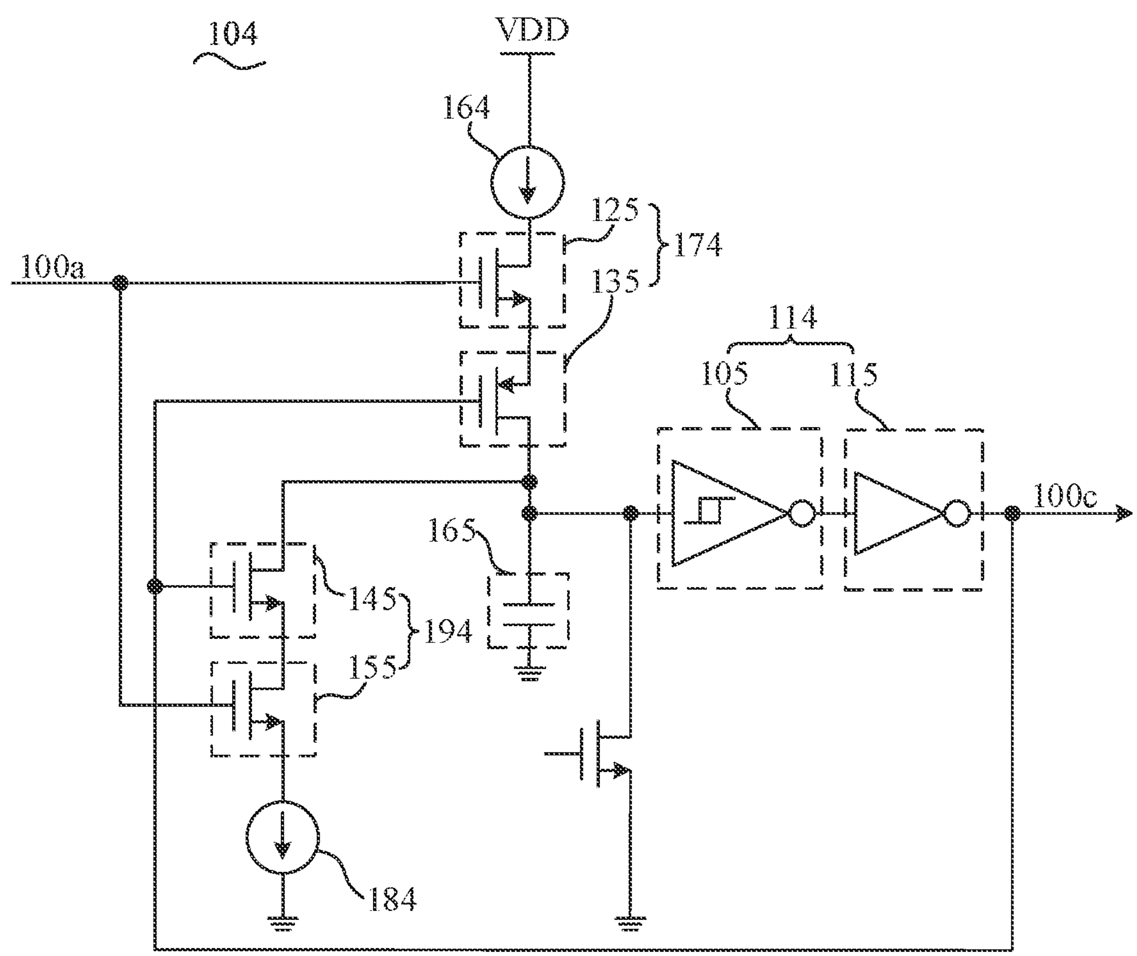

In some embodiments, referring to FIG. 10, the comparison circuit 114 includes a comparator 105 and a second inverter 115 connected in series with the comparator 105. An output terminal of the second inverter 115 is configured to output the initial pulse signal 100*c*. The first switch module 174 includes a first switch transistor 125 and a second switch transistor 135 connected in series, the first current source 164 is connected between the first switch transistor 125 and the operating power source VDD, a control terminal of the second switch transistor 135 is connected to the output terminal of the second inverter 115, and the first switch transistor 125 is enabled in response to the row strobe signal 100*a*. The second switch module 194 includes a third switch transistor 145 and a fourth switch transistor 155 connected in series, the second current source 184 is connected between the fourth switch transistor 155 and the ground terminal, a control terminal of the third switch transistor 145 is connected to the output terminal of the second inverter 115, and the fourth switch transistor 155 is enabled in response to the row strobe signal 100*a*.

When a given anti-fuse memory cell of the anti-fuse memory is programmed, the row strobe signal 100*a* is the enable signal of the ring oscillator circuit 104, and the first switch transistor 125 and the fourth switch transistor 155 are in the on state in response to the row strobe signal 100*a*. When the output terminal of the second inverter 115 outputs the first level signal 114*a* (referring to FIG. 9), the second switch transistor 135 is enabled based on the row strobe signal 100*a* and the first level signal 114*a*, the third switch transistor 145 is disabled based on the row strobe signal 100*a* and the first level signal 114*a*, and the first current source 164 pulls up the voltage across the input terminal of the comparator 105 to the first preset value at the first speed. When the output terminal of the second inverter 115 outputs the second level signal 114*b* (referring to FIG. 9), the second switch transistor 135 is disabled based on the row strobe signal 100*a* and the second level signal 114*b*, the third switch transistor 145 is enabled based on the row strobe signal 100*a* and the second level signal 114*b*, and the second current source 184 pulls down the voltage across the input terminal of the comparator 105 to the second preset value at the second speed.

It is to be understood that the comparator 105 may be configured to be enabled when the first switch transistor 125 and the second switch transistor 135 are both enabled and the voltage across the input terminal of the comparator 105 rises to the first preset value. After an electrical signal received by the input terminal of the comparator 105 is inverted, the inverted electrical signal is transmitted to the input terminal of the second inverter 115; and after the second inverter 115 inverts the electrical signal again, the first level signal 114*a* is outputted. The comparator 105 may also be configured to be enabled when the third switch transistor 145 and the fourth switch transistor 155 are both enabled and the voltage across the input terminal of the comparator 105 drops to the second preset value. After the electrical signal received by the input terminal of the comparator 105 is inverted, the inverted electrical signal is transmitted to the input terminal of the second inverter 115; and after the second inverter 115 inverts the electrical signal again, the second level signal 114*b* is outputted. As thus, the output terminal of the second inverter 115 can periodically output the first level signal 114*a* and the second level signal 114*b*, to alternately enable the second switch transistor 135 and the third switch transistor 145, such that the output terminal of the ring oscillator circuit 104 outputs the initial pulse signal 100*c*, and the initial pulse signal 100*c* with an adjustable duty factor may be formed by adjusting the first speed and the second speed.

It is to be noted that with continued reference to FIG. 10, the ring oscillator circuit 104 may also include a charge/discharge module 165. One end of the charge/discharge module 165 is electrically connected to the input terminal of the comparison circuit 114, and other end of the charge/discharge module 165 is electrically connected to the ground terminal. When the first switch transistor 125 and the second switch transistor 135 are both enabled, the charge-discharge module 165 is electrically connected to the operating power source by means of the first switch transistor 125 and the second switch transistor 135 enabled. That is, the charge-discharge module 165 is in a charging state, to prolong time required to pull up the voltage across the input terminal of the comparison circuit 114 to the first preset value. When the third switch transistor 145 and the fourth switch transistor 155 are both enabled, the charge-discharge module 165 is electrically connected to the ground terminal by means of the third switch transistor 145 and the fourth switch transistor 155 enabled. That is, the charge-discharge module 165 is in a discharging state, to prolong time required to pull down the voltage across the input terminal of the comparison circuit 114 to the second preset value. By arranging the charge/discharge module 165, it is advantageous to prolonging the period length of the initial pulse signal 100*c*, preventing the overheating of the anti-fuse memory cell caused by an excessively high programming pulse frequency, ensuring a smaller resistance after the anti-fuse memory cell is broken down, and ensuring resistance measurement accuracy of the anti-fuse memory cell. It is to be understood that the first speed and the second speed are also affected by a charging/discharging speed of the charge/discharge module 165.

In one example, the charge/discharge module 165 may be a capacitor with a variable capacitance value, and the first speed and the second speed may be adjusted by adjusting the capacitance value of the capacitor. It is to be noted that, in FIG. 10 the charge/discharge module 165 being a capacitor with a variable capacitance value merely serves as an example. In practical applications, the charge/discharge module 165 may also be other electrical devices capable of realizing the charging/discharging functions. The form of the charge/discharge module 165 is not limited to the embodiments of the present disclosure.

Figure 11:
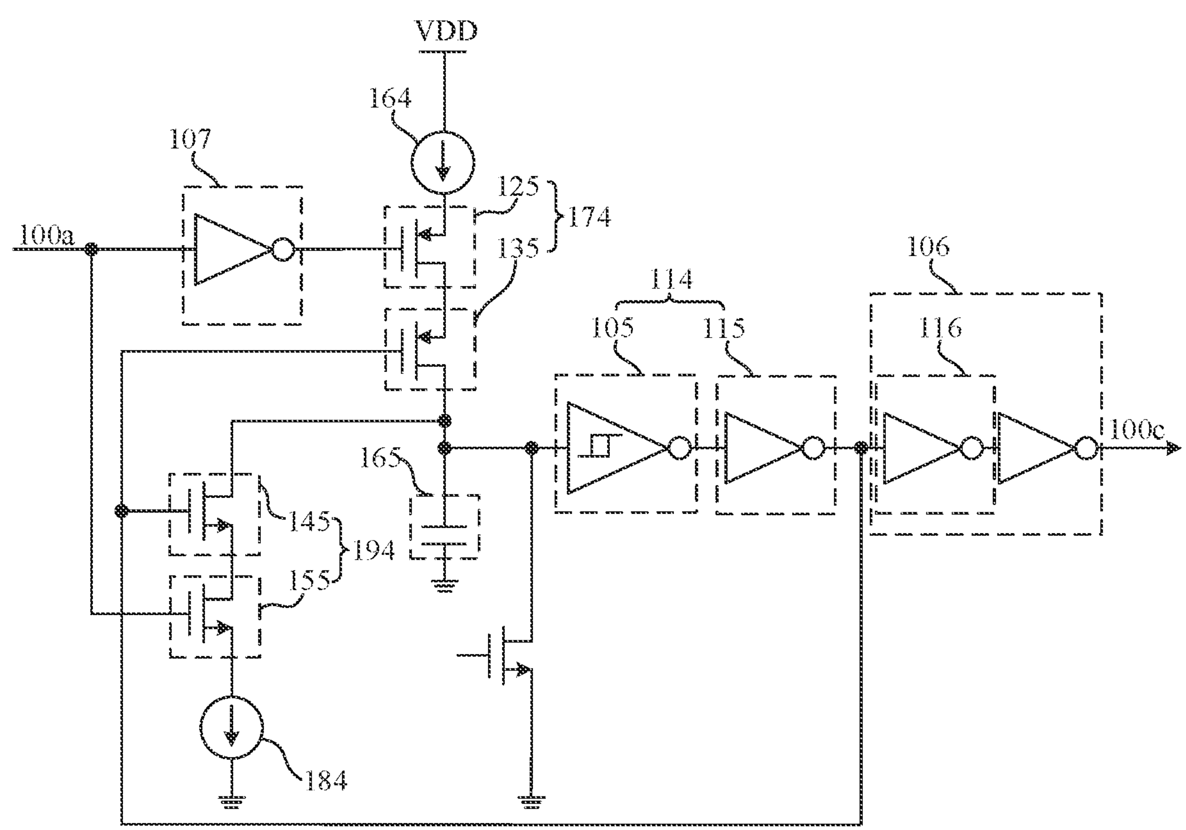

In some embodiments, referring to FIG. 11, the ring oscillator circuit 104 (referring to FIG. 10) may also include a fourth inverter 107. An input terminal of the fourth inverter 107 is configured to receive the row strobe signal 100 *a*, and an output terminal of the fourth inverter 107 is connected to the control terminal of the first switch transistor 125.

When the level value of the first level signal 114*a* is lower than that of the second level signal 114*b*, the second switch transistor 135 may be a PMOS transistor, and may be enabled based on a low level, i.e., the first level signal 114*a*; and the third switch transistor may be an NMOS transistor, and may be enabled based on a high level, i.e., the second level signal 114*b*.

In addition, the first switch transistor 125 and the fourth switch transistor 155 are enabled based on the row strobe signal 100*a*. When the anti-fuse memory is in the programming phase, the row strobe signal 100*a* is at a high level. Referring to FIG. 10, when there is neither an inverter between the control terminal of the first switch transistor 125 and the row strobe signal 100*a* nor an inverter between the fourth switch transistor 155 and the row strobe signal 100*a*, the first switch transistor 125 and the fourth switch transistor 155 may be NMOS transistors, and may be enabled based on the high level, i.e., the row strobe signal 100*a*. With reference to FIG. 11, when the fourth inverter 107 is provided between the control terminal of the first switch transistor 125 and the row strobe signal 100*a* and no inverter is provided between the fourth switch transistor 155 and the row strobe signal 100*a*, the first switch transistor 125 may be a PMOS transistor, and may be enabled based on a low level, i.e., an inversion signal of the row strobe signal 100*a*; and the fourth switch transistor 155 may be an NMOS transistor, and may be enabled based on the high level, i.e., the row strobe signal 100*a*. In practical applications, when there is an inverter between the control terminal of the first switch transistor 125 and the row strobe signal 100*a* and there is an inverter between the fourth switch transistor 155 and the row strobe signal 100*a*, both the first switch transistor 125 and the fourth switch transistor 155 are PMOS transistors, and are enabled based on the low level, i.e., the inversion signal of the row strobe signal 100*a*. When no inverter is provided between the control terminal of the first switch transistor 125 and the row strobe signal 100*a* and an inverter is provided between the fourth switch transistor 155 and the row strobe signal 100*a*, the first switch transistor 125 may be an NMOS transistor, and may be enabled based on the high level, i.e., the row strobe signal 100*a*; and the fourth switch transistor 155 may be a PMOS transistor, and may be enabled based on the low level, i.e., the inversion signal of the row strobe signal 100*a*.

It is to be noted that in FIG. 10 and FIG. 11 the first switch transistor 125 and the second switch transistor 135 are connected in series to realize the functions of the first switch module 174, which merely serves as an example. In practical applications, any circuit module that can be enabled in response to the row strobe signal 100*a* and the first level signal 114*a* may serve as the first switch module 174 in the embodiments of the present disclosure. That is, the embodiments of the present disclosure do not limit the form of the first switch module 174. In addition, in FIG. 10 and FIG. 11 the third switch transistor 145 and the fourth switch transistor 155 are connected in series to realize the functions of the second switch module 194, which merely serves as an example. In practical applications, any circuit module that can be enabled in response to the row strobe signal 100*a* and the second level signal 114*b* may serve as the second switch module 194 in the embodiments of the present disclosure. That is, the embodiments of the present disclosure do not limit the form of the second switch module 194.

In some embodiments, referring to FIG. 11, the signal generation unit 101 (referring to FIG. 6) may also include a buffer circuit 106 connected to the output terminal of the ring oscillator circuit 104 (referring to FIG. 10).

The buffer circuit 106 may include even number of third inverters 116 connected in series.

The third inverter 116 has advantages such as larger noise tolerance, higher input resistance, lower static power consumption, and insensitivity to noise and interference, and the even number of third inverters 116 connected in series may not cause the initial pulse signal 100*c* finally transmitted to the input terminal of the level translator 102 (referring to FIG. 7) to be inverted. This is advantageous to reducing interferences in the process of transmitting the initial pulse signal 100*c* from the output terminal of the ring oscillator circuit 104 to the input terminal of the level translator 102. Therefore, it is further ensured that the initial pulse signal 100*c* transmitted to the input terminal of the level translator 102 is not distorted, to ensure the accuracy of the programming pulse signal 100*b* subsequently formed based on the initial pulse signal 100*c*. This is advantageous to improving the success rate of reading the data from the anti-fuse memory and to improving the programming effect of the anti-fuse memory.

To sum up, in the entire programming process of the anti-fuse memory, the programming pulse signal 100*b* is generated based on the row strobe signal 100*a*, which is advantageous to avoiding the problem of overheating after the anti-fuse memory is broken down. In one aspect, this is advantageous to reducing the probability of damage to the anti-fuse memory and to improving yield of the anti-fuse memory. In another aspect, this is advantageous to reducing the resistance of the anti-fuse memory cell broken down in the low-resistance state. Therefore, it is advantageous to improving the success rate of reading the data from the anti-fuse memory cell, and to improving the accuracy of reading the data from the anti-fuse memory.

Another embodiment of the present disclosure provides a control method for an anti-fuse memory. This control method is configured for controlling the anti-fuse memory provided by the foregoing embodiments. The control method for an anti-fuse memory provided by another embodiment of the present disclosure will be described in detail below with reference to FIG. 2 and FIG. 4, and the parts corresponding to the foregoing embodiments will not be repeated here.

Referring to FIG. 2, the control method for the anti-fuse memory includes: generating a programming pulse signal 100*b* in response to a row strobe signal 100*a*; and programming in response to the programming pulse signal 100*b*. As thus, in the entire programming process of the anti-fuse memory, a level value of a programming voltage formed based on the programming pulse signal 100*b* changes periodically, to avoid the problem of overheating after the anti-fuse memory cell is broken down. This is advantageous to improving the accuracy of reading the data from the anti-fuse memory and improving the yield of the anti-fuse memory.

In some embodiments, referring to FIG. 4, the step of generating a programming pulse signal 100*b* in response to the row strobe signal 100*a* may include: generating the programming pulse signal 100*b* in response to the row strobe signal 100*a* and a reference pulse signal 100*d* simultaneously, wherein the reference pulse signal 100*d* has an adjustable duty factor. Because the duty factor of the reference pulse signal 100*d* is adjustable, the duty factor of the programming pulse signal 100*b* may also be adjusted by adjusting the duty factor of the reference pulse signal 100*d*.

In some other embodiments, the step of the generating a programming pulse signal 100*b* in response to the row strobe signal 100*a* may include: generating the programming pulse signal 100*b* having an adjustable duty factor in response to the row strobe signal 100*a*.

The formation of the programming pulse signal 100*b* based on the row strobe signal 100*a* may be implemented by means of the ring oscillator circuit 104, and the implementation manner is the same as the previous embodiments, and thus is not to be repeated here.

In the above embodiment, the duty factor of the programming pulse signal 100*b* is adjustable, which is advantageous to satisfying a fact that anti-fuse memory cells with different electrical properties can be programmed based on the programming pulse signal 100*b*. This is advantageous to improving the accuracy of reading the data from the anti-fuse memory and improving the yield of the anti-fuse memory.

To sum up, the anti-fuse memory generates the programming pulse signal 100*b* in response to the row strobe signal 100*a* and programmes in response to the programming pulse signal 100*b*, which is advantageous to avoiding the problem of overheating after the anti-fuse memory is broken down. In one aspect, this is advantageous to reducing the probability of damage to the anti-fuse memory and to improving the yield of the anti-fuse memory. In another aspect, this is advantageous to reducing the resistance of the anti-fuse memory broken down in the low-resistance state. Therefore, it is advantageous to improving the success rate of reading the data from the anti-fuse memory, and to improving the accuracy of reading the data from the anti-fuse memory.

Those of ordinary skill in the art can understand that the above-mentioned embodiments are some embodiments for realizing the present disclosure, but in practical applications, various changes can be made to them in form and details without departing from the spirit and scope of the present disclosure. Any person skilled in the art can make their own changes and modifications without departing from the spirit and scope of the embodiments of the present disclosure. Therefore, the protection scope of the embodiments of the present disclosure shall be subject to the scope defined by the claims.

What is claimed is:

1. An anti-fuse memory configured to generate a programming pulse signal based on a row strobe signal, a word line of the anti-fuse memory being configured to receive the row strobe signal, and the anti-fuse memory being programmed in response to the programming pulse signal;

wherein the anti-fuse memory is further configured to generate the programming pulse signal with an adjustable duty factor based on the row strobe signal.

2. The anti-fuse memory according to claim 1, wherein the anti-fuse memory is further configured to generate the programming pulse signal based on the row strobe signal and a reference pulse signal.

3. The anti-fuse memory according to claim 2, wherein the reference pulse signal is an internal clock signal.

4. The anti-fuse memory according to claim 2, wherein the anti-fuse memory comprises a reference pulse signal generation module configured to output the reference pulse signal with the adjustable duty factor.

5. The anti-fuse memory according to claim 1, wherein the anti-fuse memory comprises a pulse signal generation module configured to receive the row strobe signal and generate the programming pulse signal.

6. The anti-fuse memory according to claim 5, wherein the pulse signal generation module comprises:

a signal generation unit configured to output an initial pulse signal in response to the row strobe signal; and a level translator configured to perform level translation on the initial pulse signal to generate and output the programming pulse signal, a level value of the programming pulse signal being greater than that of the initial pulse signal.

7. The anti-fuse memory according to claim 6, wherein the signal generation unit is configured to output the initial pulse signal in response to the row strobe signal and a reference pulse signal simultaneously.

8. The anti-fuse memory according to claim 7, wherein the reference pulse signal has an adjustable duty factor.

9. The anti-fuse memory according to claim 6, wherein the signal generation unit comprises a ring oscillator circuit, the row strobe signal being an enable signal of the ring oscillator circuit, and an output terminal of the ring oscillator circuit being configured to output the initial pulse signal.

10. The anti-fuse memory according to claim 9, wherein the ring oscillator circuit is configured to output the initial pulse signal with an adjustable duty factor.

11. The anti-fuse memory according to claim 10, wherein the ring oscillator circuit comprises:

a comparison circuit, an output terminal of the comparison circuit being configured to output the initial pulse signal;

a pull-up module connected between an operating power source and an input terminal of the comparison circuit, the pull-up module being enabled in response to the row strobe signal and a first level signal outputted from the comparison circuit and being configured to pull up a voltage across the input terminal of the comparison circuit at a first speed, the first speed being adjustable; and a pull-down module connected between a ground terminal and the input terminal of the comparison circuit, the pull-down module being enabled in response to the row strobe signal and a second level signal outputted from the comparison circuit and being configured to pull down the voltage across the input terminal of the comparison circuit at a second speed, the second speed being adjustable, and a level value of the first level signal being different from that of the second level signal.

12. The anti-fuse memory according to claim 11, wherein the pull-up module comprises a first current source and a first switch module, the first switch module being connected between the first current source and the input terminal of the comparison circuit, and the first switch module being enabled in response to the row strobe signal and the first level signal; and the pull-down module comprises a second current source and a second switch module, the second switch module being connected between the second current source and the input terminal of the comparison circuit, and the second switch module being enabled in response to the row strobe signal and the second level signal, and the first current source and/or the second current source being adjustable in magnitude of current.

13. The anti-fuse memory according to claim 12, wherein the comparison circuit comprises a comparator and a second inverter connected in series with the comparator, an output terminal of the second inverter being configured to output the initial pulse signal;

the first switch module comprises a first switch transistor and a second switch transistor connected in series, the first current source being connected between the first switch transistor and the operating power source, a control terminal of the second switch transistor being connected to the output terminal of the second inverter, and the first switch transistor being enabled in response to the row strobe signal; and the second switch module comprises a third switch transistor and a fourth switch transistor connected in series, the second current source being connected between the fourth switch transistor and the ground terminal, a control terminal of the third switch transistor being connected to the output terminal of the second inverter, and the fourth switch transistor being enabled in response to the row strobe signal.

14. The anti-fuse memory according to claim 12, wherein the anti-fuse memory further comprises a current adjustment module configured to adjust magnitude of current of the first current source and/or the second current source.

15. A control method for an anti-fuse memory, the control method comprising:

generating a programming pulse signal in response to a row strobe signal; and programming in response to the programming pulse signal;

wherein the generating a programming pulse signal in response to the row strobe signal comprises: generating the programming pulse signal in response to the row strobe signal and a reference pulse signal simultaneously, the reference pulse signal having an adjustable duty factor.

16. The control method according to claim 15, wherein the generating a programming pulse signal in response to the row strobe signal comprises: generating the programming pulse signal having an adjustable duty factor in response to the row strobe signal.

* * * * *